United States Patent [19]

Hirai

[11] Patent Number: 5,440,304
[45] Date of Patent: Aug. 8, 1995

[54] INTEGRATED CIRCUIT HAVING A SHIFT STAGE COUNT CHANGING FUNCTION

[75] Inventor: Minoru Hirai, Kyoto, Japan

[73] Assignee: Rohm Co., Ltd., Japan

[21] Appl. No.: 76,463

[22] Filed: Jun. 14, 1993

[30] Foreign Application Priority Data

Jul. 27, 1992 [JP]  Japan .................................. 4-199510

[51] Int. Cl.⁶ ............................................. H03M 9/00
[52] U.S. Cl. ...................................... 341/100; 377/75
[58] Field of Search ................. 341/100, 101; 377/56, 377/75, 81, 114

[56] References Cited

U.S. PATENT DOCUMENTS 4,975,932  12/1990  Matsushima et al. .................. 377/81
5,033,067   7/1991  Cole et al. .............................. 377/76
5,321,400   6/1994  Sasaki et al. .......................... 341/100

OTHER PUBLICATIONS

Anonymous, IBM Technical Disclosure Bulletin vol. 28 No. 7, Dec. 1985, pp. 2769–2772.

Primary Examiner—Howard L. Williams
Attorney, Agent, or Firm—Samuels, Gauthier & Stevens

[57] ABSTRACT

An integrated circuit and its using method. The integrated circuit having a serial-parallel converter and a driver unit is further provided with a setting circuit which is responsive to a selection signal value for setting the number of shift stages of the serial-parallel converter. When serial data consisting of a number of bits exceeding the setup stage count is input, the serial-parallel converter outputs data as overflow serial data in order starting at the first input bit of the serial data. A plurality of the integrated circuits are cascaded so that overflow serial data output from the integrated circuit at a preceding stage is supplied to the integrated circuit at the following stage as serial data to be converted into parallel data. The same selection signal value is supplied to each of the integrated circuits.

16 Claims, 4 Drawing Sheets

INTEGRATED CIRCUIT HAVING A SHIFT STAGE COUNT CHANGING FUNCTION

BACKGROUND OF THE INVENTION

1. Field of the Invention

This invention relates to an integrated circuit for driving a liquid crystal device, etc.

2. Description of the Related Art

FIG. 3 shows an example of a liquid crystal device driving integrated circuit (IC). The IC 20 includes a bidirectional shift register 21, a latch unit 22, a level shifter 23, a driver unit 24, and logic circuits 25a and 25b. The IC 20 includes pins of DI, DO, SHL, CL1, CL2, M, $Y_1$-$Y_{80}$, V, $V_{CC}$, GND, and $V_{EE}$. The IC 20 provides an 80-bit output specification.

The bidirectional shift register 21 shifts bits of serial data at the timing synchronized with a shift clock signal supplied via the CL2 pin from an external device. The serial data whose bits are to be shifted is supplied via the DI pin and logic circuit 25a from an external device. The logic circuit 25a changes the serial data supply destination in response to a direction selection signal supplied via the SHL pin from an external device. The bidirectional shift register 21 changes the bit shift direction in response to the direction selection signal. For example, if the direction selection signal has a value indicating bit shift from right to left in FIG. 3, serial data is supplied to the bidirectional shift register 21 from right and bits of the serial data are shifted from right to left. In contrast, if the selection signal has a value indicating bit shift from left to right in FIG. 3, serial data is supplied to the bidirectional shift register 21 from left and bits of the serial data are shifted from left to right.

The bidirectional shift register 21 consists of 80 bits. Therefore, if serial data exceeding 80 bits is supplied, the bidirectional shift register 21 overflows. The overflow serial data is output via the logic circuit 25b and DO pin to the following circuit, such as another IC.

The latch unit 22, which consists of 80 bits, latches data stored in the bidirectional shift register 21 at the timing synchronized with a latch clock signal supplied via the CL1 from the external device. The serial data input via the DI pin is converted into parallel data by bit shifting by the bidirectional shift register 21 and latching by the latch unit 22. The level shifter 23 shifts the level of the parallel data for supply to the driver unit 24. Then, the driver unit 24 converts the parallel data whose level is shifted into AC drive output signals and outputs the resultant signals through the $Y_1$-$Y_{80}$ pins to liquid crystal elements. At the conversion, the driver unit 24 inputs a signal for AC conversion from the M pin and drive voltages $V_1$-$V_4$ from the V pin and uses them for conversion. 80 liquid crystal elements (not shown) are disposed.

The $V_{CC}$, GND, and $V_{EE}$ pins are IC positive power supply, ground, and negative power supply pins respectively.

To cascade ICs 20 shown in FIG. 3, the DO pin of the preceding IC 20 should be connected to the DI pin of the following IC 20. Then, for example, if eight ICs 20 are cascaded, drive output signals of 80×8=640 dots can be provided.

If the number of dots is not an integer multiple of 80 dots, the following methods are available: Method A by which a necessary number of dots are charged equally to each of ICs 20 and method B by which each device of the ICs 20 is used as 80-dot output and the remainder given by dividing the total of dots by 80 is charged to one IC 20.

Assume that the liquid crystal device 26 provides 24×24 dots=576 dots for static character display. Method A requires the circuit configuration as shown in FIG. 4, for example. Method B requires the circuit configuration as shown in FIG. 5, for example.

For method A, because 72×8=576, each of eight ICs 20 may be used as a 72-bit output IC without using output pins $Y_{73-80}$ (eight bits) of each IC 20. On the other hand, for method B, because 80×7+16=576, all of seven ICs 20 may be used 80-bit output ICs with the eighth IC 20 as a 16-bit output IC.

To display a character made up of 16×16=256 dots, if method A is used, each of four ICs 20 may be used as a 64-bit output IC; if method B is used, three ICs 20 may be used as 80-bit output ICs with the fourth device of IC 20 as a 16-bit output IC. Likewise, to display a character made up of 32×32=1024 dots, if method A is used, sixteen ICs 20 may be used as 64-bit output ICs; if method B is used, twelve ICs 20 are used as 80-bit output ICs and eleven ICs 20 are used as 64-bit output ICs. Further, to display a character made up of 48×48=2304 dots, if method A is used, thirty-two ICs 20 are used as 72-bit output ICs; if method B is used, twenty-eight ICs 20 are used as 80-bit output ICs and one IC 20 is used as a 64-bit output IC.

These methods are not adequate.

First, when the necessary total of output bits cannot be divided by the number of output bits of a single IC 20 (in the example given above, 80 bits), if method A is used, some of the Y pins are not used to drive the liquid crystal device 26. For example, if only 72 bits of 80 Y pins (80 bits) are used, eight Y pins (eight bits) remain unused. Therefore, data input through the DI pin of the IC 20 at the first stage must be mixed with dummy data in such a manner that 8-bit dummy data is input before significant 72-bit serial data is input. The process of mixing serial data with dummy data is very complicated. Although it is possible to change the output bit specification of the IC 20 according to the number of dots of the liquid crystal device 20 to be driven, it is not economical to provide many types of output bit specifications of the IC 20 so as to cover all of various kinds of specifications of the number of dots of the liquid crystal device 26.

Method B does not introduce such a problem. However, if the necessary total of output bits cannot be divided by the number of output bits of a single IC 20, only some of the Y pins of the IC 20 at the last stage are used unlike other ICs 20 at preceding stages. This means that the IC 20 at the last stage and other ICs 20 must differ in wiring pattern between the IC 20 and the liquid crystal device 26. Therefore, special consideration must be given to the last IC 20 to assemble circuitry containing a cascade of the ICs 20. Thus, method B introduces a problem of an increase in the number of assembly steps.

SUMMARY OF THE INVENTION

Accordingly, it is an object of the invention to eliminate the need for mixing serial data to be input with dummy data even if the necessary total of output bits cannot be divided by the number of output bits of a single IC.

Another object of the invention is to eliminate the need for providing ICs having the number of output bits conforming to the number of dots of the target to be driven, such as a liquid crystal device.

A further object of the invention is to make it possible to make identical the numbers of output bits at the ICs cascaded.

An even further object of the invention is to reduce design and production costs by accomplishing the above-mentioned objects.

To these ends, according to the invention, there is provided an integrated circuit which comprises:

a) means for converting serial data into parallel data and for outputting the parallel data and overflow serial data;

b) means being responsive to the parallel data for driving a target to be driven; and c) means for setting the number of shift stages of the conversion means;

wherein the conversion means outputs bits of the input serial data as the overflow serial data in order of exceeding the number of shift stages.

According to the invention, there is provided a shift stage count setting circuit for an integrated circuit comprising:

a) means for converting serial data into parallel data and for outputting the parallel data and overflow serial data; and b) means for setting the number of shift stages of the conversion means;

wherein the conversion means outputs bits of the input serial data as the overflow serial data in order of exceeding the number of shift stages.

According to the invention, there is provided a method of using an integrated circuit comprising the steps of:

a) supplying serial data to the integrated circuit; and b) supplying a selection signal to the integrated circuit;

wherein the setting means, responsive to the selection signal value, sets the number of shift stages of the conversion means.

In the invention, the number of shift stages of the conversion means is set by the setting means. When serial data consisting of a number of bits exceeding the setup stage count is input, the conversion means outputs data as overflow serial data in order starting at the first input bit of the serial data. Therefore, an integrated circuit having any number of output bits can be provided by setting the number of shift stages. When cascading the integrated circuits and supplying the overflow serial data to an integrated circuit at the following stage as serial data to be converted into parallel data, the numbers of output bits of integrated circuits can be made identical. At the time, dummy data is not required.

A shift register can be used as the conversion means. The targets to be driven are liquid crystal devices, etc. The drive means can be made of a latch unit, level shifter, driver unit, etc.

For example, the setting means can be designed for setting the number of shift stages of the conversion means in response to the value of selection signal supplied from an external device, in which case the setting means can further include gate means being responsive to the selection signal for selecting either of intermediate and last bits of the shift register as last shift stage. The number of bits of selection signal may be set to a count to enable selecting any of the numbers of shift stages that can be set. For setting the number of shift stages of the plurality of integrated circuits as same, the same selection signal value may be supplied to each of the integrated circuits.

DESCRIPTION OF THE PREFERRED EMBODIMENTS

Figure 1:
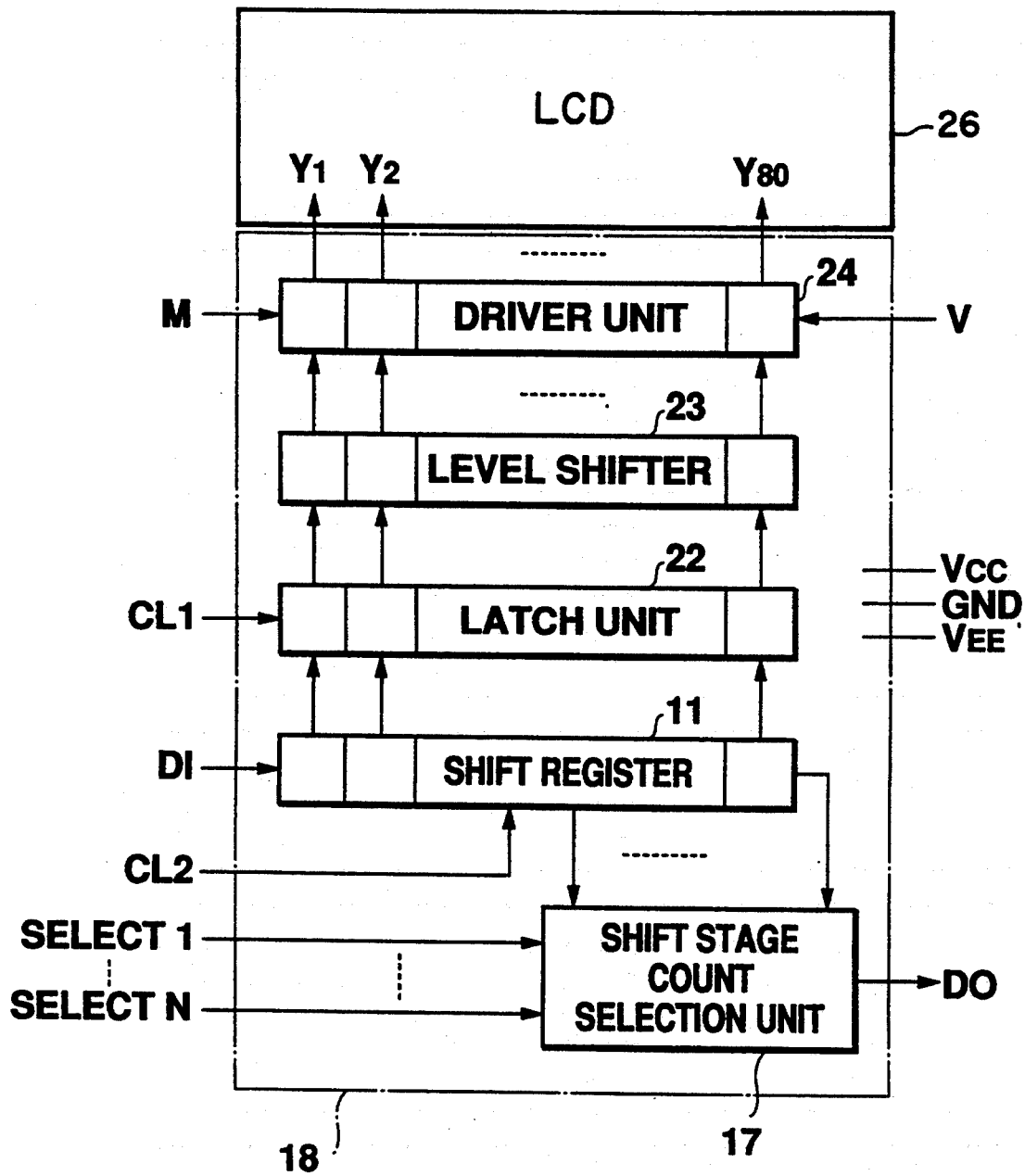
FIG. 1 is a block diagram of an IC according to an embodiment of the invention.

Referring now to the accompanying drawings, there are shown preferred embodiments of the invention. The corresponding circuit parts to those shown in FIG. 3 are designated by the same reference numerals in FIGS. 1 and 2, and are not discussed again.

FIG. 1 shows an embodiment for implementing the invention as a liquid crystal device driving IC 18, wherein the IC 18 provides an 80-bit output specification like the conventional IC example. The IC 18 includes a shift register 11, a latch unit 22, a level shifter 23, a driver unit 24, and a shift stage count selection unit 17. The IC 18 includes pins of SELECT 1–SELECT N in addition to DI, DO, CL1, CL2, M, $Y_1$–$Y_{80}$, V, $V_{CC}$, GND, and $V_{EE}$.

The value of the intermediate bits as well as the value of the last bit of the shift register 11 is input to the shift stage count selection unit 17. The shift stage count selection unit 17 selects the value of the bit specified by a combination of values of N types of selection signals (N is an integer of 2 or greater) supplied via the SELECT 1–SELECT N pins from an external device, and outputs it through the DO pin. That is, the shift stage count selection unit 17 selects the number of shift bits of the shift register 11 in response to the combination of the values of the N types of selection signals.

Figure 2:
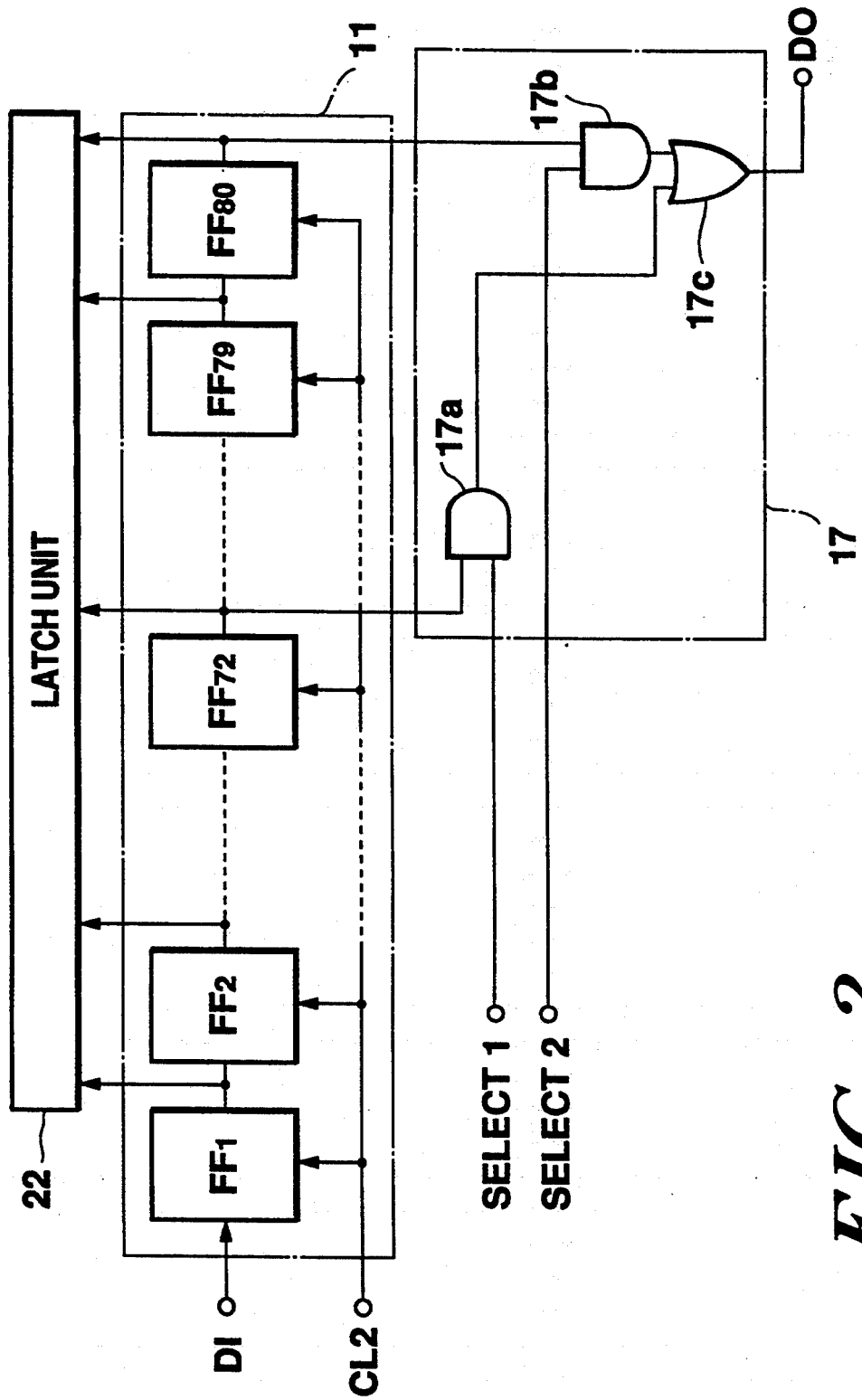
FIG. 2 is a diagram of main blocks of a more specific IC of the embodiment shown in FIG. 1.
Figure 3:
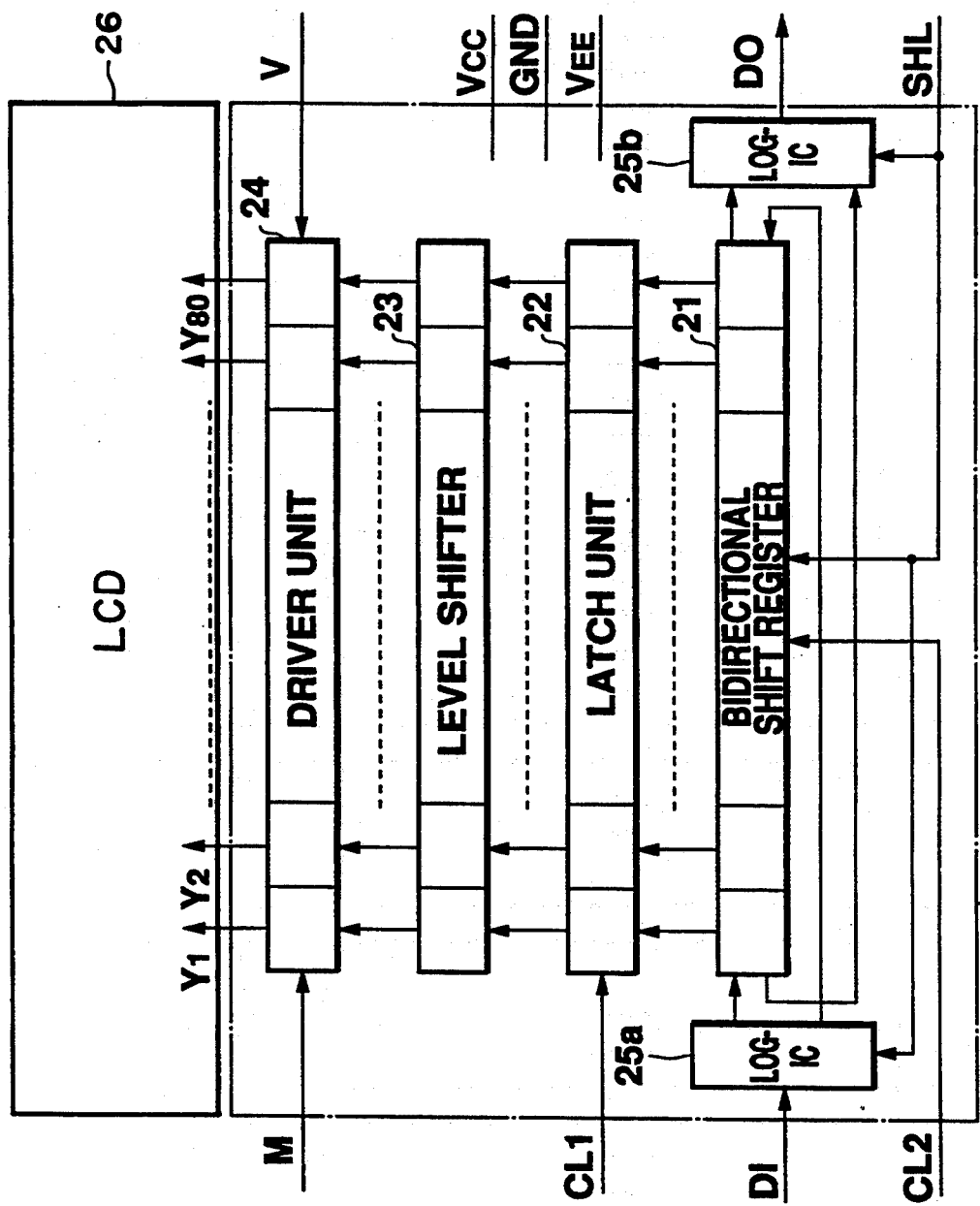
FIG. 3 is a block diagram of a conventional IC.

FIG. 2 shows an example of the configuration with N=2 in the embodiment, wherein particularly the internal configuration of the shift register 11 and shift stage count selection unit 17 is shown.

In FIG. 2, the shift register 11 contains a cascade of 80 flip-flops $FF_1$–$FF_{80}$. The shift stage count selection unit 17 is made up of AND gates 17a and 17b and an OR gate 17c. A selection signal indicating selection of output of the flip-flop $FF_{72}$ is input through the SELECT 1 pin and a selection signal indicating selection of output of the flip-flop $FF_{80}$ is input through the SELECT 2 pin. The AND gate 17a gates output of the flip-flop $FF_{72}$ in response to the selection signal input through the SELECT 1 pin and the AND gate 17b gates output of the flip-flop $FF_{80}$ in response to the selection signal input through the SELECT 2 pin. The OR gate 17c outputs OR of the outputs of the AND gates 17a and 17b to an external device through the DO pin. Therefore, the output of the flip-flop corresponding to the selection signal whose value is high is output to the external device through the DO pin.

Figure 4:
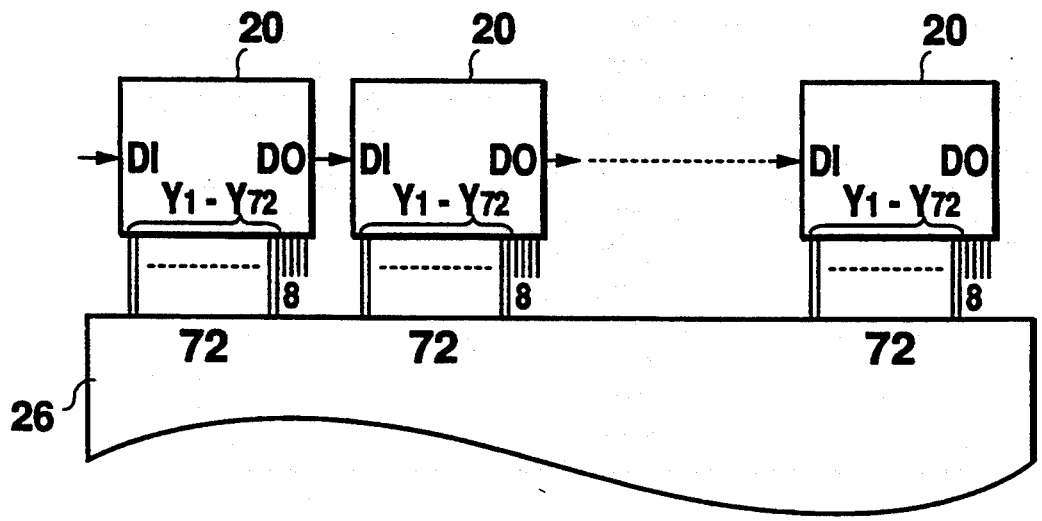
FIG. 4 is a drawing for illustrating method A.
Figure 5:
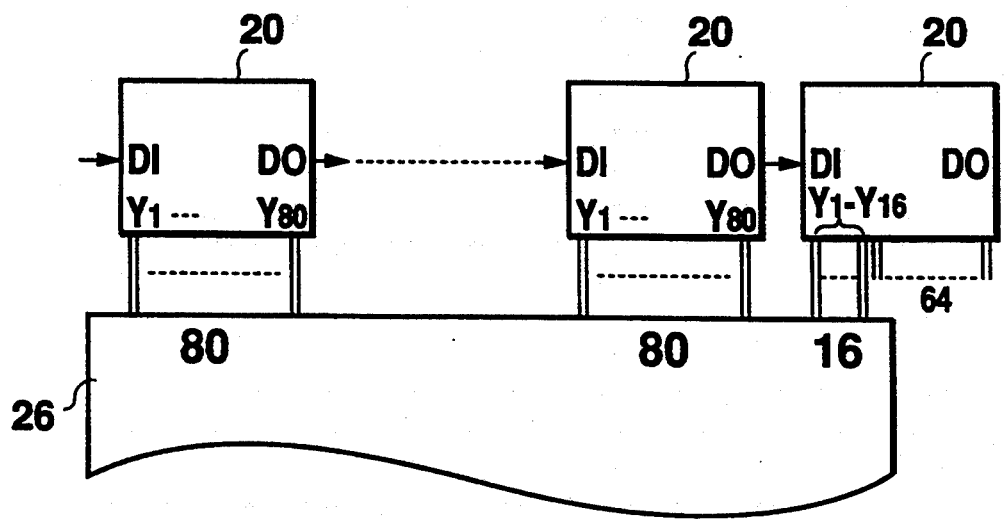
FIG. 5 is a drawing for illustrating method B.

To use a cascade of devices of the IC 18 having the configuration shown in FIG. 2 for driving a liquid crystal device 26 of 24×24=576 dots, first, eight ICs 18 are connected to the liquid crystal device 26 as shown in FIG. 4. Further, selection signals which are high and low are supplied via the SELECT 1 and SELECT 2 pins, respectively, of each IC 18. Then, the number of shift bits of the shift register 11 of each ICs 18 is set to 72. Since 72×8=576, such connection and setting enable the liquid crystal device 26 of 24×24=576 dots to be driven.

In more detail, serial data overflowing from the shift register 11 where the number of shift bits is set to 72 is output via the DO pin to the IC 18 at the following stage. At the time, dummy data required for method A need not be provided. Of course, the serial data overflowing from the shift register 11 is also supplied to the flip-flops $FF_{73}$ and later. However, the data in the flip-flops $FF_{73}$ and later is not used to drive the liquid crystal device 26 because the $Y_{73}$–$Y_{80}$ pins of the IC 18 are not connected to the liquid crystal device 26. Therefore, no problems arise.

Therefore, according to the embodiment of the invention, the actual number of output bits of the IC 18 can be set to any desired value and the needs for a process of mixing with dummy data and for providing a large number of types of IC specifications are eliminated by supplying selection signals to the IC 18 in addition to the connection shown in FIG. 4. Since there is no IC used with an incomplete number of output bits as compared with method B, the number of assembly steps and assembly costs are reduced.

The invention is not limited to the configuration in FIG. 2. It is not limited to the configuration for setting the number of shift stages of the shift register 11 to 72 or 80. For example, if the shift stage count selection unit 17 is configured with a data selector, any number of shift stages can be set. Preferably, 16, 32, 48, 64, 80 stages, etc., should be provided as the numbers of shift stages that can be set. In this case, only three bits are required for the number of selection signal bits. If the number of selection signal bits is further increased, the numbers of shift stages can be set finer. For the example in FIG. 2 in which the number of shift stages is selected between two types, one type of selection signal may be given from an external device and be input to an inverter for generating two types of selection signals complementary to each other.

Further, the invention is not limited to driving of the liquid crystal device 26; it can also be used to drive devices such as LEDs (light emitting diodes) and heating elements. Therefore, applications of the invention can be widened to various printers such as liquid crystal printers, LED printers, and thermal printers.

What is claimed is:

1. An integrated circuit comprising:
   means for converting serial data into parallel data and for outputting the parallel data and overflow serial data;
   means being responsive to said parallel data for driving a target to be driven; and
   means for setting the number of shift stages of said conversion means;
   wherein the conversion means outputs bits of the input serial data as the overflow serial data in order of exceeding the number of shift stages, said setting means being responsive to a selection signal value supplied from an external device for setting the number of shift stages of said conversion means, said conversion means including a shift register for shifting the serial data a predetermined number of bits in response to a shift clock, and said setting means including gate selecting means being responsive to the selection signal for selecting only one of either an intermediate bit value or a last bit value of said shift register for outputting as overflow serial data.

2. The integrated circuit as claimed in claim 1 wherein said conversion means includes a shift register for shifting the serial data a predetermined number of bits in response to a shift clock.

3. The integrated circuit as claimed in claim 1 wherein the target to be driven is a liquid crystal device.

4. The integrated circuit as claimed in claim 1 wherein said drive means includes a latch unit for latching the parallel data.

5. The integrated circuit as claimed in claim 1 wherein said drive means includes a level shifter for shifting a level of the parallel data.

6. The integrated circuit as claimed in claim 1 wherein said drive means includes a driver unit for selectively supplying drive power to the target to be driven in response to values of bits of the parallel data.

7. The integrated circuit as claimed in claim 1 wherein said setting means is responsive to a selection signal value supplied from an external device for setting the number of shift stages of said conversion means.

8. The integrated circuit as claimed in claim 7 wherein said conversion means includes a shift register for shifting the serial data a predetermined number of bits in response to a shift clock and said setting means includes gate means being responsive to the selection signal for selecting either of intermediate and last shift stages of said shift register for outputting as overflow serial data.

9. The integrated circuit as claimed in claim 8 wherein the number of selection signal bits is a count to enable selecting any of the numbers of shift stages that can be set.

10. A shift stage count setting circuit for an integrated circuit comprising:
    means for converting serial data into parallel data and for outputting the parallel data and overflow serial data;
    exceeding a predetermined number of shift stages is input, said means for outputting data as overflow serial data in order starting at the first input bit of said serial data; and
    means for setting the number of shift stages of said conversion means;
    wherein the conversion means outputs bits of the input serial data as the overflow serial data in order of exceeding the number of shift stages, said setting means being responsive to a selection signal value supplied from an external device for setting the number of shift stages of said conversion means, said conversion means including a shift register for shifting the serial data a predetermined number of bits in response to a shift clock, and said setting means including gate selecting means being responsive to the selection signal for selecting only one of either an intermediate bit value or a last bit value of said shift register for outputting as overflow serial data.

11. The setting circuit as claimed in claim 10 wherein said conversion means includes a shift register for shifting the serial data a predetermined number of bits in response to a shift clock.

12. The setting circuit as claimed in claim 10 wherein said setting means is responsive to a selection signal value supplied from an external device for setting the number of shift stages of said conversion means.

13. The setting circuit as claimed in claim 12 wherein said conversion means includes a shift register for shifting the serial data a predetermined number of bits in response to a shift clock and said setting means includes gate means being responsive to the selection signal for selecting either of intermediate and last shift stages of said shift register for outputting as overflow serial data.

14. A method of using an integrated circuit comprising the steps of:

a first step of supplying serial data to said integrated circuit; and a second step of supplying a selection signal to said integrated circuit;

said integrated circuit comprising:

means for converting serial data into parallel data for outputting the parallel data and overflow serial data;

means being responsive to said parallel data for driving a target to be driven; and means being responsive to a selection signal value for setting the number of shift stages of said conversion means;

wherein the conversion means outputs bits of the input serial data s the overflow serial data in order of exceeding the number of shift stages, said setting means being responsive to a selection signal value supplied from an external device for setting the number of shift stages of said conversion means, said conversion means including a shift register for shifting the serial data a predetermined number of bits in response to a shift clock, and said setting means including gate means being responsive to the selection signal for selecting only one of either an intermediate bit value or a last bit value of said shift register for outputting as overflow serial data.

15. The method of using the integrated circuit as claimed in claim 14 further comprising the steps of:

cascading a plurality of said integrated circuits so that overflow serial data output from said integrated circuit at a preceding stage is supplied to said integrated circuit at a following stage as serial data to be converted into parallel data; and executing said second step for each of said integrated circuit cascaded.

16. The method of using the integrated circuit as claimed in claim 15 wherein the same selection signal value is supplied to each of said integrated circuits.

* * * * *